United States Patent
Elmedyb et al.

(10) Patent No.: US 11,310,607 B2
(45) Date of Patent: Apr. 19, 2022

(54) METHOD OF OPERATING A HEARING AID SYSTEM AND A HEARING AID SYSTEM

(71) Applicant: Widex A/S, Lynge (DK)

(72) Inventors: Thomas Bo Elmedyb, Herlev (DK); Lars Dalskov Mosgaard, Copenhagen (DK); Michael Johannes Pihl, Copenhagen (DK); Georg Stiefenhofer, Hundested (DK); Pejman Mowlaee, Valby (DK); Adam Westermann, Copenhagen (DK)

(73) Assignee: Widex A/S, Lynge (DK)

( * ) Notice: Subject to any disclaimer, the term of this patent is extended or adjusted under 35 U.S.C. 154(b) by 0 days.

(21) Appl. No.: 17/049,619

(22) PCT Filed: Apr. 26, 2019

(86) PCT No.: PCT/EP2019/060738
§ 371 (c)(1),
(2) Date: Oct. 22, 2020

(87) PCT Pub. No.: WO2019/211187
PCT Pub. Date: Nov. 7, 2019

(65) Prior Publication Data
US 2021/0274295 A1    Sep. 2, 2021

(30) Foreign Application Priority Data

Apr. 30, 2018    (DK) .............................. PA201800188

(51) Int. Cl.
*H04R 25/00*    (2006.01)
(52) U.S. Cl.
CPC .......... *H04R 25/505* (2013.01); *H04R 25/43* (2013.01); *H04R 25/48* (2013.01); *H04R 2225/43* (2013.01)

(58) Field of Classification Search
CPC ...................................................... H04R 25/00
USPC ................................................. 381/312, 316
See application file for complete search history.

(56) References Cited

U.S. PATENT DOCUMENTS

| | | | | |
|---|---|---|---|---|
| 5,892,836 A | * | 4/1999 | Ishige | H04R 25/505 |
| | | | | 381/316 |
| 8,180,081 B2 | * | 5/2012 | Lunner | H04R 25/453 |
| | | | | 381/318 |
| 2003/0187637 A1 | | 10/2003 | Kang et al. | |
| 2007/0118367 A1 | | 5/2007 | Dickson et al. | |
| 2008/0256160 A1 | | 10/2008 | Lusk et al. | |
| 2012/0063620 A1 | * | 3/2012 | Nomura | G01S 3/803 |
| | | | | 381/316 |
| 2015/0092966 A1 | * | 4/2015 | Andersen | H04R 25/00 |
| | | | | 381/316 |

FOREIGN PATENT DOCUMENTS

| | | |
|---|---|---|
| EP | 3 182 729 A1 | 6/2017 |
| WO | 2007/053086 A1 | 5/2007 |

OTHER PUBLICATIONS

International Search Report for PCT/EP2019/060738 dated Aug. 9, 2019 [PCT/ISA/210].

(Continued)

*Primary Examiner* — Suhan Ni
(74) *Attorney, Agent, or Firm* — Sughrue Mion, PLLC

(57) ABSTRACT

A method of operating a hearing aid system comprising a hearing aid (300) wherein a digital filter (302) is adapted to be of minimum phase and to provide a frequency dependent target gain.

14 Claims, 3 Drawing Sheets

(56) References Cited

OTHER PUBLICATIONS

Written Opinion for PCT/EP2019/060738 dated Aug. 9, 2019 [PCT/ISA/237].
Danish Search Report for PA 2018 00188 dated Jun. 26, 2018.

* cited by examiner

METHOD OF OPERATING A HEARING AID SYSTEM AND A HEARING AID SYSTEM

CROSS REFERENCE TO RELATED APPLICATIONS

This application is a National Stage of International Application No. PCT/EP2019/060738 filed Apr. 26, 2019, claiming priority based on Danish Patent Application No. PA201800188 filed Apr. 30, 2018.

The present invention relates to a method of operating a hearing aid system. The present invention also relates to a hearing aid system adapted to carry out said method.

BACKGROUND OF THE INVENTION

Generally, a hearing aid system according to the invention is understood as meaning any device which provides an output signal that can be perceived as an acoustic signal by a user or contributes to providing such an output signal, and which has means which are customized to compensate for an individual hearing loss of the user or contribute to compensating for the hearing loss of the user. They are, in particular, hearing aids which can be worn on the body or by the ear, in particular on or in the ear, and which can be fully or partially implanted. However, some devices whose main aim is not to compensate for a hearing loss, may also be regarded as hearing aid systems, for example consumer electronic devices (televisions, hi-fi systems, mobile phones, MP3 players etc.) provided they have, however, measures for compensating for an individual hearing loss.

Within the present context a traditional hearing aid can be understood as a small, battery-powered, microelectronic device designed to be worn behind or in the human ear by a hearing-impaired user. Prior to use, the hearing aid is adjusted by a hearing aid fitter according to a prescription. The prescription is based on a hearing test, resulting in a so-called audiogram, of the performance of the hearing-impaired user's unaided hearing. The prescription is developed to reach a setting where the hearing aid will alleviate a hearing loss by amplifying sound at frequencies in those parts of the audible frequency range where the user suffers a hearing deficit. A hearing aid comprises one or more microphones, a battery, a microelectronic circuit comprising a signal processor, and an acoustic output transducer. The signal processor is preferably a digital signal processor. The hearing aid is enclosed in a casing suitable for fitting behind or in a human ear.

Within the present context a hearing aid system may comprise a single hearing aid (a so called monaural hearing aid system) or comprise two hearing aids, one for each ear of the hearing aid user (a so called binaural hearing aid system). Furthermore, the hearing aid system may comprise an external device, such as a smart phone having software applications adapted to interact with other devices of the hearing aid system. Thus, within the present context the term "hearing aid system device" may denote a hearing aid or an external device.

The mechanical design has developed into a number of general categories. As the name suggests, Behind-The-Ear (BTE) hearing aids are worn behind the ear. To be more precise, an electronics unit comprising a housing containing the major electronics parts thereof is worn behind the ear. An earpiece for emitting sound to the hearing aid user is worn in the ear, e.g. in the concha or the ear canal. In a traditional BTE hearing aid, a sound tube is used to convey sound from the output transducer, which in hearing aid terminology is normally referred to as the receiver, located in the housing of the electronics unit and to the ear canal. In some modern types of hearing aids, a conducting member comprising electrical conductors conveys an electric signal from the housing and to a receiver placed in the earpiece in the ear. Such hearing aids are commonly referred to as Receiver-In-The-Ear (RITE) hearing aids. In a specific type of RITE hearing aids the receiver is placed inside the ear canal. This category is sometimes referred to as Receiver-In-Canal (RIC) hearing aids.

In-The-Ear (ITE) hearing aids are designed for arrangement in the ear, normally in the funnel-shaped outer part of the ear canal. In a specific type of ITE hearing aids the hearing aid is placed substantially inside the ear canal. This category is sometimes referred to as Completely-In-Canal (CIC) hearing aids. This type of hearing aid requires an especially compact design in order to allow it to be arranged in the ear canal, while accommodating the components necessary for operation of the hearing aid.

Hearing loss of a hearing impaired person is quite often frequency-dependent. This means that the hearing loss of the person varies depending on the frequency. Therefore, when compensating for hearing losses, it can be advantageous to utilize frequency-dependent amplification. Hearing aids therefore often provide to split an input sound signal received by an input transducer of the hearing aid, into various frequency intervals, also called frequency bands, which are independently processed. In this way, it is possible to adjust the input sound signal of each frequency band individually to account for the hearing loss in respective frequency bands. The frequency dependent adjustment is normally done by implementing a band split filter and compressors for each of the frequency bands, so-called band split compressors, which may be summarised to a multi-band compressor. In this way, it is possible to adjust the gain individually in each frequency band depending on the hearing loss as well as the input level of the input sound signal in a specific frequency range. For example, a band split compressor may provide a higher gain for a soft sound than for a loud sound in its frequency band.

The filter banks used in such multi-band compressors are well known within the art of hearing aids but are nevertheless based on a number of tradeoffs. Most of these tradeoffs deal with the frequency resolution as will be further described below.

There are some very clear advantages of having a high-resolution filter bank. The higher the frequency resolution, the better individual periodic components can be distinguished from each other. This gives a much finer signal analysis and enables more advanced signal processing. Especially noise reduction and speech enhancement schemes may benefit from a higher frequency resolution.

However, a filter bank with a high frequency resolution generally introduces a correspondingly long delay, which for most people will have a detrimental effect on the perceived sound quality.

It has therefore been suggested to reduce the delay incurred by filter banks, such as Discrete Fourier Transform (DFT) and Finite Impulse Response (FIR) filter banks by: applying a time-varying filter with a response that corresponds to the frequency dependent target gains that were otherwise to be applied to the frequency bands provided by the filter banks. However, this solution still requires that the frequency dependent gains are calculated in an analysis part of the system, and in case the analysis part comprises filter banks, then the determined frequency dependent gains will be delayed relative to the signal that the gains are to be applied to using the time-varying filter. Furthermore, the time-varying filter in itself will inherently introduce a delay although this delay is generally significantly shorter than the delay introduced by the filter banks. It has furthermore been suggested in the art to minimize the delay introduced by the time-varying filter by implementing the time-varying filter as minimum-phase. While low delay processing is attractive it remains a challenge to design digital filter minimum phase synthetization algorithms that don't require more processing resources than are available in contemporary hearing aid systems.

It is therefore a feature of the present invention to provide an improved method of operating a hearing aid system with low delay signal processing.

It is another feature of the present invention to provide a hearing aid system adapted to provide such a method of operating a hearing aid system.

SUMMARY OF THE INVENTION

The invention, in a first aspect, provides a method of operating a hearing aid system comprising the steps of:
  analyzing an input signal in order to provide a frequency dependent target gain that is adapted to at least one of suppressing noise, enhancing a target sound, customizing the sound to a user preference and alleviating a hearing deficit of an individual wearing the hearing aid system;
  determining the real cepstrum of the frequency dependent target gain;
  using the real cepstrum of the frequency dependent target gain to provide a desired minimum phase filter impulse response;
  updating a digital filter, configured to provide the frequency dependent target gain, to provide the desired minimum phase filter impulse response,
wherein at least one of the steps of:
  determining the real cepstrum of the frequency dependent target gain, and
  using the real cepstrum of the frequency dependent target gain to provide a desired minimum phase filter impulse response,
is carried out by applying at least one of a discrete cosine transformation and a discrete sine transformation.

This provides an improved method of operating a hearing aid system with respect to especially processing delay.

The invention, in a second aspect, provides a hearing aid system comprising in a main signal branch:
an acoustical-electrical input transducer (301), a time-varying digital filter (302) and an electrical-acoustical output transducer (303); and comprising, in an analysis signal branch:
an analysis filter bank (304), a frequency dependent target gain calculator (305), a natural logarithm calculator (306), a smoothing filter (307), a discrete cosine transformation circuit (308), a cepstrum domain window (309), a discrete sine transformation circuit (310), a digital combiner (311), an exponential calculator (312), a minimum phase filter transfer calculator (313), a minimum phase impulse response calculator (314) and a main digital filter coefficient calculator (315).

This provides a hearing aid system with improved means for operating a hearing aid system.

The invention, in a third aspect, provides a non-transitory computer readable medium carrying instructions which, when executed by a computer, cause the following method to be performed:
  analyzing an input signal in order to provide a frequency dependent target gain that is adapted to at least one of suppressing noise, enhancing a target sound, customizing the sound to a user preference and alleviating a hearing deficit of an individual wearing the hearing aid system;
  determining the real cepstrum of the frequency dependent target gain;
  using the real cepstrum of the frequency dependent target gain to provide a desired minimum phase filter impulse response;
  updating a digital filter, configured to provide the frequency dependent target gain, to provide the desired minimum phase filter impulse response,
wherein at least one of the steps of:
  determining the real cepstrum of the frequency dependent target gain, and
  using the real cepstrum of the frequency dependent target gain to provide a desired minimum phase filter impulse response,
is carried out by applying at least one of a discrete cosine transformation and a discrete sine transformation.

Further advantageous features appear from the dependent claims.

Still other features of the present invention will become apparent to those skilled in the art from the following description wherein the invention will be explained in greater detail.

BRIEF DESCRIPTION OF THE DRAWINGS

By way of example, there is shown and described a preferred embodiment of this invention. As will be realized, the invention is capable of other embodiments, and its several details are capable of modification in various, obvious aspects all without departing from the invention. Accordingly, the drawings and descriptions will be regarded as illustrative in nature and not as restrictive. In the drawings.

DETAILED DESCRIPTION

In the present context the term signal processing is to be understood as any type of hearing aid system related signal processing that includes at least: noise reduction, speech enhancement and hearing compensation.

Figure 1:
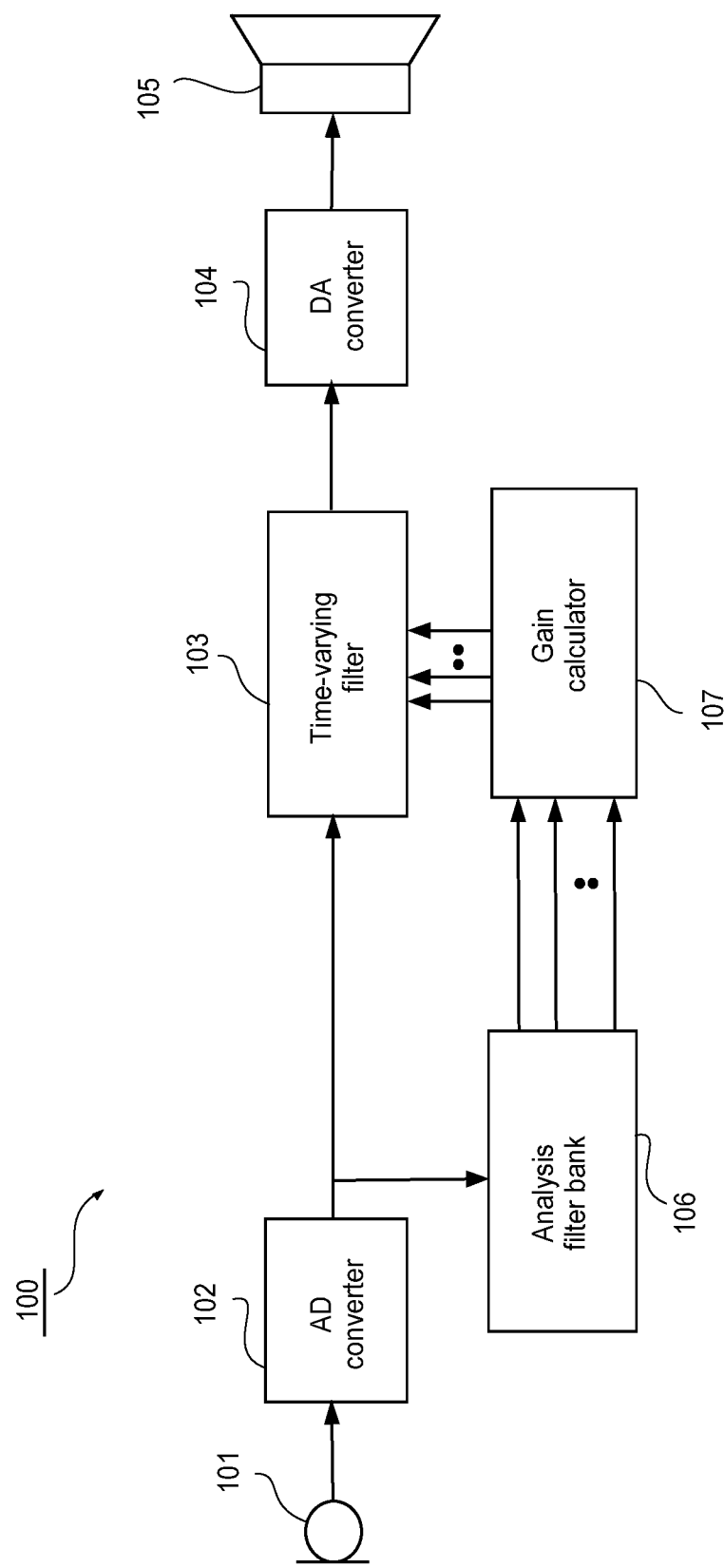
FIG. 1 illustrates highly schematically a hearing aid system according to an embodiment of the prior art.

Reference is first made to FIG. 1, which illustrates highly schematically a hearing aid system 100 according to an embodiment of the prior art.

The hearing aid system 100 comprises an acoustical-electrical input transducer 101, i.e. a microphone, an analog-digital converter (ADC) 102, a time-varying filter 103, a digital-analog converter (DAC) 104, an electro-acoustical output transducer, i.e. the hearing aid speaker 105, an analysis filter bank 106 and a gain calculator 107.

According to the embodiment of FIG. 1, the microphone 101 provides an analog input signal that is converted into a digital input signal by the analog-digital converter 102. However, in the following, the term digital input signal may be used interchangeably with the term input signal and the same is true for all other signals referred to in that they may or may not be specifically denoted as digital signals.

The digital input signal is branched, whereby the input signal, in a first branch (that may also be denoted the main signal branch), is provided to the time-varying filter 103 and, in a second branch (that may also be denoted the analysis signal branch), provided to the analysis filter bank 106. The digital input signal, in the first branch, is filtered by the time-varying filter 103 that applies a frequency dependent target gain. This filtered digital signal is subsequently provided to the digital-analog converter 104 and further on to the acoustical-electrical output transducer 105 for conversion of the signal into sound.

The digital input signal, in the second branch, is split into a multitude of frequency band signals by the analysis filter bank 106 and provided to the gain calculator 107 that determines a frequency dependent target gain that is adapted to at least one of suppressing noise, enhancing a target sound, customizing the sound to a user preference and alleviating a hearing deficit of an individual wearing the hearing aid system, and based on the frequency dependent target gain derives corresponding filter coefficients for the time-varying filter 103.

The frequency dependent (and time-varying) target gain may be adapted to improve speech intelligibility or suppressing noise or customizing the sound or all of the above in addition to being adapted to alleviating an individual hearing deficit.

The analysis filter bank 106 may be implemented in the time-domain or in the frequency domain using e.g. Discrete Fourier Transformation (DFT).

The digital-analog converter 104 may be implemented as a sigma-delta converter, e.g. as disclosed in EP-B1-793897. However, in the following the terminology digital-analog converter is used independent of the chosen implementation.

Methods for deriving filter coefficients for a digital filter in order to adapt the digital filter to be of minimum phase and provide a frequency dependent target gain $|H(k)|$ are well known in the prior art. As one specific example of a prior art method the following approach may be used:

In a first step an input signal is analyzed in order to provide a frequency dependent target gain that is adapted to at least one of suppressing noise, enhancing a target sound, customizing the sound to a user preference and alleviating a hearing deficit of an individual wearing the hearing aid system.

In a second step obtaining the real cepstrum ($c_R(n)$) of the complex cepstrum ($\hat{x}(n)$) of the desired frequency dependent target gain ($|H(k)|$) by taking the inverse Fourier transformation (IFT) of the (natural) logarithm of the frequency dependent target gain. Generally the relation between the real cepstrum, the complex cepstrum, the frequency dependent target gain and the filter transfer function $H(k)$ is given by:

$$\hat{x}(n) = IFT[\log(H(k))] \qquad (eq.\ 1)$$
$$= IFT[\log((|H(k)|) + i\ \arg(H(k)))]$$
$$= IFT[\log|H(k)|] + IFT[i\ \arg(H(k))]$$

and consequently that the real cepstrum ($c_R(n)$) is given by:

$$c_R(n) = IFT[\log(|H(k)|)] \qquad (eq.\ 2)$$

In the following the inverse Fourier transformation (IFT) may also be abbreviated IDTF to emphasize that most signal processing today is digital, but in the present context the two terms may be used interchangeably.

In a third step applying a window function to the real cepstrum of the frequency dependent target gain ($|H(k)|$), whereby the complex cepstrum representing the desired minimum phase filter impulse response is provided:

$$\hat{x}_{min}(n) = l_{min}(n) c_R(n) \qquad (eq.\ 3)$$

Thus the window function $l_{min}$ is the unique function that can reconstruct the minimum phase complex cepstrum from the real cepstrum representing the frequency dependent target gain.

The discrete and finite window function $l_{min}$ is given as:

$$l_{min}(n) = 2 - \delta(n) - \delta(N/2 - n) \qquad (eq.\ 4)$$
$$\forall n > \frac{N}{2}, l_{min}(n) = 0$$

Wherein N is the length of the IDTF used to provide the real cepstrum, $\delta(n)$ is the Kronecker delta function and n is the cepstrum variable.

In a fourth step applying a Fourier transformation to the provided complex cepstrum and hereby providing a logarithmic filter transfer function that is minimum phase.

In a fifth step determining a filter transfer function ($H_{min}(k)$) that is minimum phase by applying an exponential function to the provided logarithmic filter transfer function.

In a sixth step applying an inverse Fourier transformation to the filter transfer function that is minimum phase and hereby providing the desired minimum phase filter impulse response ($h_{min}(n)$).

In a final and seventh step using the desired minimum phase filter impulse response to derive filter coefficients that will make the digital filter minimum phase and provide the desired frequency dependent target gain.

The inventors have found that the efficiency of the methods for deriving the filter coefficients can be significantly improved if the real cepstrum of the desired frequency dependent target gain is obtained by applying a discrete Cosine transformation (DCT) instead of applying an inverse discrete Fourier transformation.

According to a first aspect the efficiency improvement is obtained because the calculations required to provide the real cepstrum of the frequency dependent target gain can be significantly simplified by utilizing that the logarithm of the frequency dependent target gain may be configured as a real and even function.

Using a standard IDFT the real cepstrum ($c_R(n)$) of the frequency dependent target gain can be expressed as:

$$c_R(n) = \operatorname{Re}(\hat{x}(n)) = \operatorname{Re}\left( \frac{1}{N} \sum_{k=0}^{N-1} \log(|H(k)|) e^{\frac{i 2\pi k n}{N}} \right) \qquad (eq.\ 5)$$
$$= \frac{1}{N} \sum_{k=0}^{N-1} \log(|H(k)|) \cos\left(\frac{2\pi k n}{N}\right)$$

Wherein, $\hat{x}(n)$ represents the complex cepstrum, log is the natural logarithm, $H(k)$ represents the filter transfer function, $|H(k)|$ represents the frequency dependent target gain and wherein N represents the length of the Fourier transformation.

Utilizing that both the cosine function and the logarithm of the frequency dependent target gain may be configured as even functions i.e. that:

$$\log(|H(k)|) = \log(|H(N-k)|), \quad \text{(eq. 6)}$$

$$\cos\left(\frac{2\pi k n}{N}\right) = \cos\left(\frac{2\pi(N-k)n}{N}\right)$$

then the expression (eq. 5), for the real cepstrum can be further simplified:

$$c_R(n) = \frac{1}{N}\sum_{k=0}^{N-1} \log(|H(k)|) \cos\left(\frac{2\pi k n}{N}\right)$$

$$= \frac{1}{N}\left\{2\sum_{k=1}^{N/2-1} \log(|H(k)|) \cos\left(\frac{2\pi k n}{N}\right) + \log(|H(0)|) + \log(|H(N/2)|)\right\}$$

$$= \frac{1}{N}\sum_{k=0}^{N/2} \epsilon(k)\log(|H(k)|) \cos\left(\frac{2\pi k n}{N}\right)$$

Wherein $\epsilon(0)=\epsilon(N-1)=1$, and $\epsilon(k)=2$ for $k \in [1: N/2-1]$. Thus by changing variables such that $N'=\frac{1}{2}N$ we get:

$$c_R(n) = \frac{1}{2N'}\sum_{k=0}^{N'} \epsilon(k)\log(|H(k)|) \cos\left(\frac{\pi k n}{N'}\right) \quad \text{(eq. 8)}$$

and when leaving out normalization and scale factors we see that the derived expression for the real part of the cepstrum $c_R(n)$ takes the form of a type I Discrete Cosine Transform $DCT_I$ (wherein the normalization and scale factors have been left out):

$$DCT_I(F(k)) = \sum_{k=0}^{N'} F(k) \cos\left(\frac{\pi k n}{N'}\right) \quad \text{(eq. 9)}$$

Thus, by using the $DCT_I$ rather than the inverse Fourier transform the computational load is reduced with about a factor of four. First a factor of two is gained because the $DCT_I$ only calculates a real cepstrum. Secondly another factor of two is gained because the $DCT_I$ is only calculated up to N/2+1 (see eq. 7) relative to the N-length IDFT (see eq. 5) as a consequence of both the cosine function and the logarithm function being even.

Furthermore, an additional efficiency improvement may be obtained by applying the $DCT_I$ because the window function given by eq. 4 can be simplified as a consequence of the cosine transformation only providing a real cepstrum with real and positive values and therefore the half of the n-values (i.e. the n-values larger than N/2), which are zeroed out by the window function of equation (4) are not calculated by the $DCT_I$.

According to the present embodiment the desired minimum phase filter impulse response $h_{min}(n)$ may therefore be derived by first determining the complex cepstrum $\hat{x}_{min}(n)$ (i.e. the complex cepstrum representing the desired minimum phase filter impulse response) by multiplying the real cepstrum $c_R(n)$ with the window function $l_{min}(n)$:

$$\hat{x}_{min}(n) = l_{min}(n)c_R(n) \quad \text{(eq. 10)}$$

and subsequently applying the fourth to sixth steps as given above, i.e.:

$$\text{IFT}[\exp(\text{FT}[\hat{x}_{min}(n)])] = \text{IFT}[\exp(\hat{X}_{min}(k))] = \text{IFT}[H_{min}(k)] = h_{min}(n) \quad \text{(eq. 11)}$$

However, according to a variation of the present embodiment the desired minimum phase impulse response $h_{min}(n)$ is determined directly from the complex cepstrum representing the desired minimum phase filter transfer function $\hat{x}_{min}(n)$ using a simple recursive formula:

$$h_{min}(n) = \begin{cases} \exp(\hat{x}_{min}(n)), n = 0 \\ \hat{x}_{min}(n)h_{min}(0) + \sum_{k=0}^{n-1}\frac{k}{n}\hat{x}_{min}(k)h_{min}(n-k), n > 0 \end{cases} \quad \text{(eq. 12)}$$

The use of this formula is advantageous in that the requirements to hearing aid system memory is limited. It is furthermore noted that this variation is particularly advantageous for minimum phase filter lengths that are not too long, since the complexity of the calculations and thereby the required current consumption scales with the filter length squared and as such may become unattractive if very long filters (such as longer than 40 filter coefficients) are required.

Generally, a Fourier transformation or inverse Fourier transformation, according to the invention, are carried out using a transformation that is selected from a group comprising: discrete Fourier transformation (DFT), discrete time Fourier transformation (DTFT), Hartley Transformation and polynomial functions converging towards the DTFT for input signal sample lengths approaching infinity.

Figure 2:
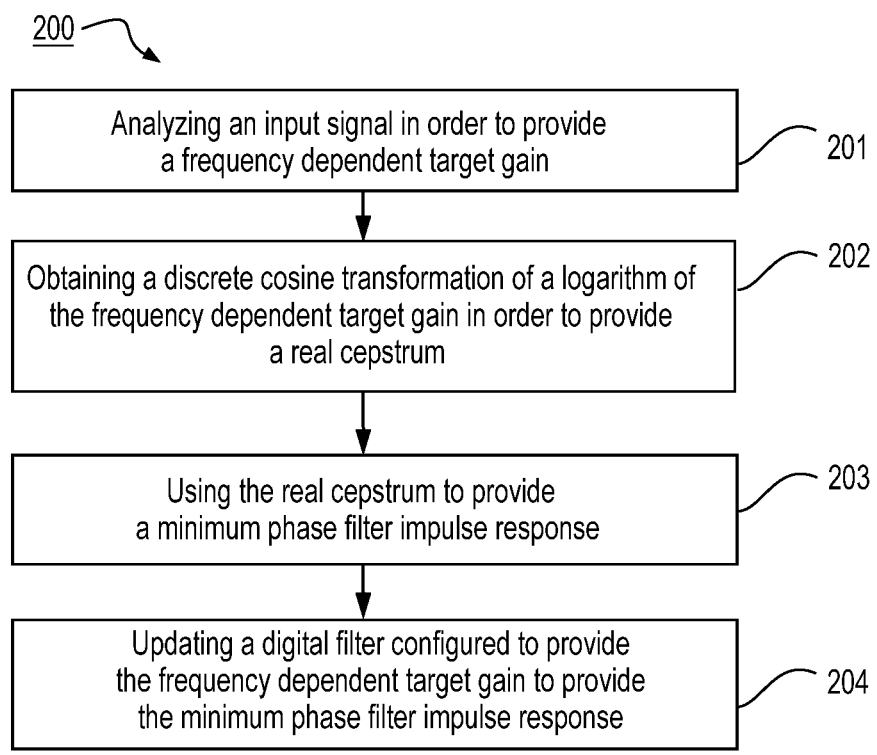
FIG. 2 illustrates highly schematically a method of operating a hearing aid system according to an embodiment of the invention.

Reference is now made to FIG. 2, which illustrates highly schematically a method 200 of operating a hearing aid system according to an embodiment of the invention.

In a first step 201, an input signal is analyzed in order to provide a frequency dependent target gain that is adapted to at least one of suppressing noise, enhancing a target sound, customizing the sound to a user preference and alleviating a hearing deficit of an individual wearing the hearing aid system.

In a second step 202, a $DCT_I$ of a logarithm of the frequency dependent target gain is obtained and hereby is provided a real cepstrum of the frequency dependent target gain.

In a variation the logarithm of the frequency dependent target gain is smoothed by a digital filter that is configured to limit the bin to bin variation of the frequency dependent target gain to be below a pre-determined threshold, whereby it may be ensured that a given digital filter length is sufficient to represent the smoothed frequency dependent target gain while also being of minimum phase.

In a third step 203, the real cepstrum is used to provide a desired minimum phase filter impulse response.

In a fourth and final step 204, a digital filter, configured to provide the frequency dependent target gain, is updated in order to provide the desired minimum phase filter impulse response.

Hereby is provided a method of operating a hearing aid system 200 with a very low processing delay, that is particularly processing efficient.

According to an embodiment, the desired minimum phase filter impulse response is optimized based on a cost function derived from perceptual criteria in order to achieve the best possible sound quality. In this way an optimum compromise between perceived sound quality and matching of the resulting frequency dependent gain with the initially determined frequency dependent target gain is achieved. In a variation of this embodiment, the optimum compromise is determined based on user interaction and in a further variation the user interaction is controlled by an interactive personalization scheme, wherein a user is prompted to select between different settings of the two filters and based on the user responses the interactive personalization scheme finds an optimized setting. Further details on one example of such an interactive personalization scheme may be found e.g. in WO-A1-2016004983.

A method of optimizing the filter coefficients based on user preference through an interactive personalization scheme is particularly attractive because it is difficult to predict in advance the cost function that best suits the individual user's preferences. Therefore effective optimization may be achieved using an interactive personalization scheme.

Generally the inventors have found that all DFT's and IDFT's required to carry out a minimum phase filter synthetization may be replaced by either a Discrete Cosinus Transformation (DCT) of the Type I or a Discrete Sinus Transformation (DST) of the Type I respectively whereby an even more processing efficient method of minimum phase filter synthetization is achieved.

According to a first aspect it has already been disclosed above how the calculation of an IDFT of a logarithm of a frequency dependent target gain, in order to provide a real cepstrum, may advantageously be carried out by calculating a DCT of type I of the logarithm of the frequency dependent target gain.

According to a second aspect the inventors have found that use of a DST' may be used to further improve efficiency. Consider now the window function $l_{min}(n)$, see eq. (4), that is used to provide the complex cepstrum $\hat{x}_{min}(n)$ representing the desired minimum phase filter impulse response by multiplying the window function $l_{min}(n)$, and the real cepstrum $c_R(n)$, (see eq. (3)).

The inventors have realized that the real part of the Fourier transform of the complex cepstrum $\hat{x}_{min}(n)$ is equal to the Fourier transform of the real cepstrum $c_R(n)$, i.e:

$$\text{Real}\{FT[l_{min}(n)c_R(n)]\}=FT[c_R(n)] \qquad \text{(eq. 13)}$$

Here from it follows that the window function $l_{min}(n)$ only introduces a phase component and considering now the imaginary part of the Fourier transform of the multiplication of the window function $l_{min}(n)$ and the real cepstrum $c_R(n)$ we find:

$$\text{Imag}\{FT[l_{min}(n)c_R(n)]\} = \text{Imag}\left\{\sum_{n=0}^{N-1} l_{min}(n)c_R(n)e^{\frac{-i2\pi kn}{N}}\right\}$$

$$= -\sum_{n=0}^{N-1} l_{min}(n)c_R(n)\text{Sin}\left(\frac{2\pi kn}{N}\right) =$$

Using that $l_{min}(n)=0 \ \forall \ n>N/2$ we find that:

$$-\sum_{n=0}^{\frac{N}{2}} l_{min}(n)c_R(n)\text{Sin}\left(\frac{2\pi kn}{N}\right) = -\sum_{n=1}^{\frac{N}{2}-1} l_{min}(n)c_R(n)\text{Sin}\left(\frac{2\pi kn}{N}\right) \qquad \text{(eq. 14)}$$

That is recognized as a discrete sine transformation of Type I ($DST_I$) and consequently it is possible to replace the step of applying a Fourier Transform with a step of applying a $DST_I$ and hereby saving processing resources similar to what was achieved above when replacing an IDFT with a $DCT_I$.

According to a third aspect, consider now that because the real cepstrum $c_R(n)$ is a real function and because the window function $l_{min}(n)$ only introduces a phase component, see eq. (14), then it follows that for the Fourier Transform of the complex cepstrum $\hat{x}_{min}(n)$ which in the following is denoted the minimum phase logarithmic filter transfer function $\hat{X}_{min}(k)$ we find:

$$\hat{X}_{min}(-k)=\hat{X}_{min}(k)^* \Rightarrow \text{Real}\{\hat{X}_{min}(-k)\}+\text{Imag}\{\hat{X}_{min}(-k)\}=\text{Real}\{\hat{X}_{min}(k)\}-\text{Imag}\{\hat{X}_{min}(k)\} \qquad \text{(eq. 15)}$$

Wherefrom it follows that the real part of $\hat{X}_{min}(k)$, which in the following is denoted $\hat{X}_{min,R}(k)$, is even and that the imaginary part of $\hat{X}_{min}(k)$, which in the following is denoted $\hat{X}_{min,I}(k)$, is odd. Now in order to determine the desired filter transfer function that is minimum phase we determine the exponential of the minimum phase logarithmic filter transfer function $\hat{X}_{min}(k)$, i.e.:

$$\exp(\hat{X}_{min}(k))=\exp(\hat{X}_{min,R}(k))\exp(i\hat{X}_{min,I}(k))=\exp(\hat{X}_{min,R}(k))(\text{Cos}(\hat{X}_{min,I}(k))+i\,\text{Sin}(\hat{X}_{min,I}(k))=\exp(\hat{X}_{min,R}(k))\text{Cos}(\hat{X}_{min,I}(k))+i\,\exp(\hat{X}_{min,R}(k))\text{Sin}(\hat{X}_{min,I}(k)) \qquad \text{eq. 16}$$

Wherein $\exp(\hat{X}_{min}(k))$ represents the desired filter transfer function that is minimum phase, wherein $\exp(\hat{X}_{min,R}(k))$ represents the frequency dependent target gain, which is clear by recognizing that the real part of the filter transfer function that is minimum phase (i.e. $\exp(\hat{X}_{min,R}(k))$) has not been changed as part of the modifications in the cepstral domain and therefore the original values of the previously defined frequency dependent target gain (i.e. $|H(k)|$) can simply be re-used for determining the real part of the filter transfer function that is minimum phase (i.e. $\exp(\hat{X}_{min,R}(k))$, and wherein $\hat{X}_{min,I}(k)$ as described above may be determined as the discrete sine transformation of the complex cepstrum representing the desired minimum phase filter impulse response. Thus $\hat{X}_{min,I}(k)$ represents the phase function of the desired minimum phase filter impulse response.

It is worth noting that equation (16) represents a particularly efficient way of providing the minimum phase filter transfer function that corresponds to a previously defined frequency dependent target gain due to the re-use of the frequency dependent target gain and the use of the more efficient $DST_I$ instead of a conventional Fourier Transform.

Now the desired minimum phase impulse response ($h_{min}(n)$) may be determined as the IDFT of the minimum phase filter transfer function that in order to improve readability in the following will be denoted $H_{min}(k)$ instead of $\exp(\hat{X}_{min}(k))$:

$$h_{min}(n) = \frac{1}{N}\sum_{k=0}^{N-1} H_{min}(k)e^{\frac{i2\pi kn}{N}} = \quad \text{(eq. 17)}$$

$$\frac{1}{N}\sum_{k=0}^{N-1} (H_{min,R}(k) + i\ H_{min,I}(k))(\text{Cos}(2\pi kn/N) + i\text{Sin}(2\pi kn/N))$$

and using that all odd functions sum to zero:

$$h_{min}(n) = \frac{1}{N}\sum_{k=0}^{N-1} H_{min,R}(n)\ \text{Cos}(2\pi kn/N) - H_{min,I}(k))\ \text{Sin}(2\pi kn/N)) \quad \text{(eq. 18)}$$

It can now be seen that the first term can be simplified to a DCT of type I and that the second term can be simplified to a DST of type I, wherefrom it follows that further efficiency improvements may be achieved.

According to an additional variation the logarithm of the frequency dependent target gain vector is filtered with a zero phase smoothing filter, One example of such a filter is a bit shifted smoothing filter characterised in being provided by adding a vector representing the logarithm of the frequency dependent target gain with a bit shifted and scaled version of itself and this specific bit shifted smoothing filter is particularly advantageous in being computationally very efficient.

Furthermore according to an advantageous aspect the smoothing of the frequency dependent target gain may be used to ensure that the available number of filter coefficients for the minimum phase digital filter is sufficient to provide a reasonable approximation of the frequency dependent target gain.

Furthermore, it can be advantageous to carry out the smoothing before the logarithm of the frequency dependent target gain is transformed into the cepstrum domain, because this enables the initial value of the frequency dependent target gain to be reused when determining the desired minimum phase filter impulse response.

Figure 3:
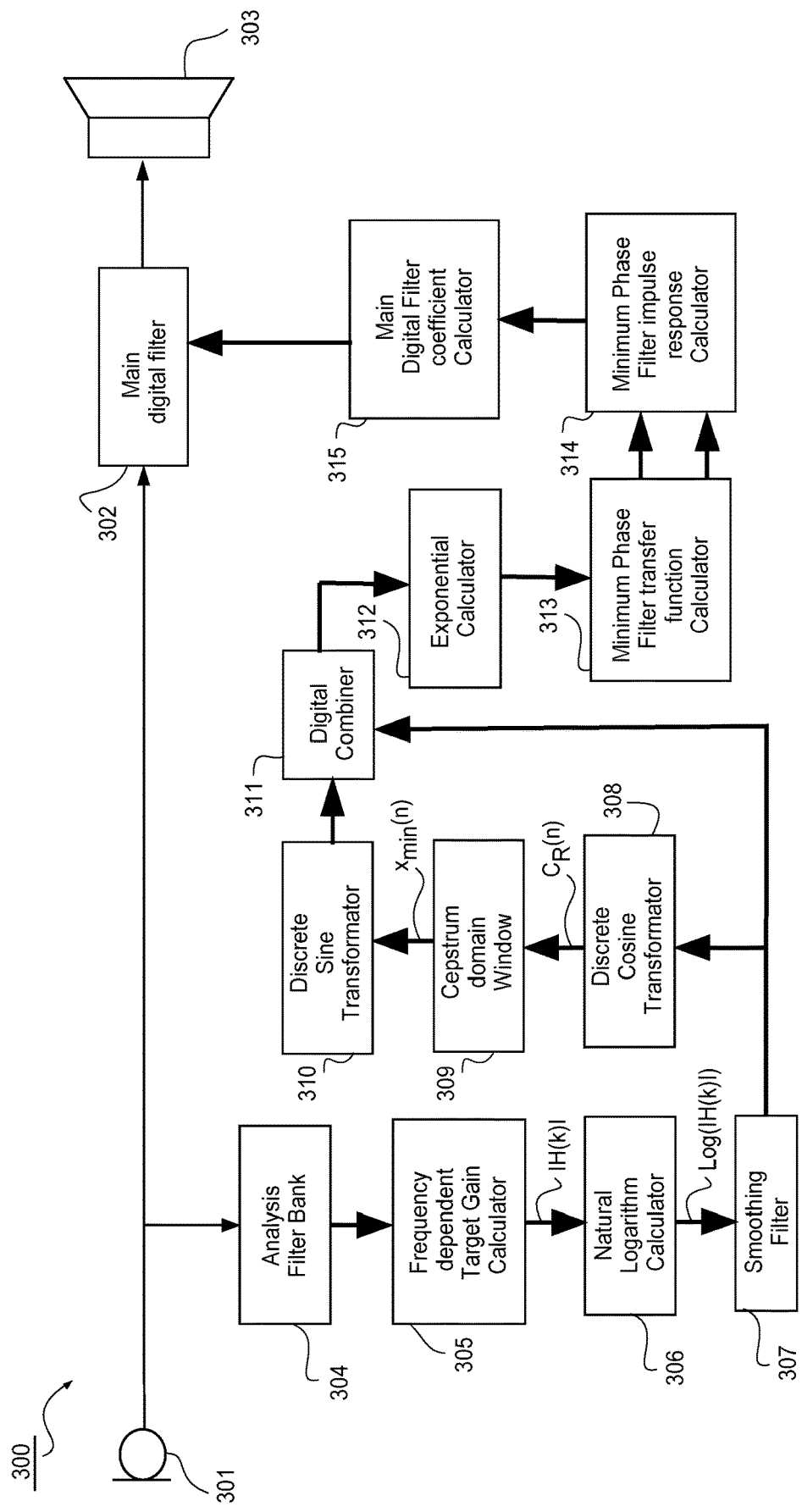
FIG. 3 illustrates highly schematically a hearing aid of a hearing aid system according to an embodiment of the invention.

Reference is now given to FIG. 3, which illustrates highly schematically a hearing aid 300 of a hearing aid system according to a particularly advantageous embodiment of the invention. The hearing aid 300 is similar to the hearing aid 100 according to the embodiment of FIG. 1 except in that specific details concerning the filter synthetization required to provide filter coefficients to the time-varying filter 302 (that in the following also may be denoted main digital filter) such that the desired frequency dependent target gain is provided by the time-varying digital filter 302 while also being minimum phase.

In FIG. 3 some of the arrows are drawn in bold in order to illustrate a multitude of frequency bands that are initially provided by the analysis filter bank 304. The frequency band signals, which are at least derived from the at least one acoustical-electrical input transducer 301, are provided to a frequency dependent target gain calculator 305 wherein a frequency dependent target gain (|H(k)|), adapted to at least one of suppressing noise, enhancing a target sound, customizing the sound to a user preference and alleviating a hearing deficit of an individual wearing the hearing aid, is determined. According to the present embodiment the number of frequency bands is 15, but in variations may be in the range between say 3 and 512.

The frequency dependent target gain is provided to a natural logarithm calculator 306 and therefrom to a smoothing filter 307 that is configured to limit the bin to bin variation of frequency dependent target gain to be below a pre-determined threshold in order to ensure that the chosen length of the time-varying filter 302 is sufficient to represent the desired frequency dependent target gain while being of minimum phase.

The smoothed frequency dependent target is branched and provided both to a digital combiner 311 and to a discrete cosine transformation circuit 308 that provides a real cepstrum of the frequency dependent target gain ($C_R(n)$). Next a cepstrum domain window 309 is applied to the real cepstrum of the frequency dependent target gain in order to provide a complex cepstrum ($\hat{x}_{min}$) representing the desired minimum phase filter impulse response.

The complex cepstrum ($\hat{x}_{min}$) is then provided to a discrete sine transformation circuit 310 and therefrom to the digital combiner 311 wherein the discrete sine transformation of the complex cepstrum, which represents a phase function, is combined with the logarithmic and smoothed frequency dependent target gain.

Subsequently the combined output from the digital combiner 411 is provided to an exponential calculator 312 that applies an exponential function and together with the minimum phase filter transfer calculator 313 provides a filter transfer function that is minimum phase, as already explained with reference to equation (16).

The minimum phase filter transfer function is then provided to a minimum phase impulse response calculator 314 wherein a discrete cosine transformation is applied to the product of the real part of the filter transfer function and a normalization function and adding the result to the result of applying a discrete sine transformation to the imaginary part of the filter transfer function whereby a desired minimum phase filter impulse response is provided.

In the final step the desired minimum phase filter impulse response is provided to the main digital filter coefficient calculator 315 that determines the corresponding filter coefficients and updates the main filter 302 with the coefficients.

Thus the hearing aid 300 provides a single minimum phase digital filter 302 adapted to provide at least one of suppressing noise, enhancing a target sound, customizing the sound to a user preference and alleviating a hearing deficit of an individual wearing the hearing aid.

In further variations the methods and selected parts of the hearing aid systems according to the disclosed embodiments may also be implemented in systems and devices that are not hearing aid systems (i.e. they do not comprise means for compensating a hearing loss), but nevertheless comprise both acoustical-electrical input transducers and electro-acoustical output transducers. Such systems and devices are at present often referred to as hearables. However, a headset is another example of such a system.

In still other variations a non-transitory computer readable medium carrying instructions which, when executed by a computer, cause the methods of the disclosed embodiments to be performed.

Other modifications and variations of the structures and procedures will be evident to those skilled in the art.

The invention claimed is:

1. A method of operating a hearing aid system comprising the steps of:
    analyzing an input signal in order to provide a frequency dependent target gain that is adapted to at least one of suppressing noise, enhancing a target sound, customizing the sound to a user preference and alleviating a hearing deficit of an individual wearing the hearing aid system;

determining the real cepstrum of the frequency dependent target gain;
using the real cepstrum of the frequency dependent target gain to provide a desired minimum phase filter impulse response;
updating a digital filter, configured to provide the frequency dependent target gain, to provide the desired minimum phase filter impulse response,
wherein at least one of the steps of:
determining the real cepstrum of the frequency dependent target gain, and using the real cepstrum of the frequency dependent target gain to provide a desired minimum phase filter impulse response,
is carried out by applying at least one of a discrete cosine transformation and a discrete sine transformation.

2. The method according to claim 1, wherein the step of determining the real cepstrum of the frequency dependent target gain comprises the step of:
applying the discrete cosine transformation to a logarithm of the frequency dependent target gain.

3. The method according to claim 2, wherein the applied discrete cosine transformation is of type I.

4. The method according to claim 1, wherein the step of using the real cepstrum of the frequency dependent target gain to provide a desired minimum phase filter impulse response comprises the further steps of:
applying a window function to the real cepstrum of the frequency dependent target gain in order to provide a complex cepstrum representing the desired minimum phase filter impulse response,
applying a discrete Fourier transformation to the complex cepstrum and hereby providing a logarithmic filter transfer function that is minimum phase,
determining a filter transfer function that is minimum phase by applying an exponential function to the provided logarithmic filter transfer function that is minimum phase,
applying an inverse discrete Fourier transformation to the filter transfer function that is minimum phase and hereby providing the desired minimum phase filter impulse response.

5. The method according to claim 4, wherein the step of applying a window function to the real cepstrum of the frequency dependent target gain in order to provide a complex cepstrum representing the desired minimum phase filter impulse response comprises the steps of:
applying a window function, $l_{min}(n)$, of the form:

$$l_{min}(n) = 2 - \delta(n) - \delta(N/2-n)$$

wherein $\delta(n)$ is the Kronecker delta function, N is the corresponding IDFT length and wherein:

$$\forall n > \frac{N}{2}, l_{min}(n) = 0.$$

6. The method according to claim 1, wherein the step of using the real cepstrum of the frequency dependent target gain to provide a desired minimum phase filter impulse response comprises the further steps of:
applying a window function to the real cepstrum of the frequency dependent target gain in order to provide a complex cepstrum representing the desired minimum phase filter impulse response,
determining the minimum phase impulse response $h_{min}(n)$, from the complex cepstrum representing the desired minimum phase filter impulse response $\hat{x}_{min}(n)$ using a recursive formula given by:

$$h_{min}(n) = \begin{cases} \exp(\hat{x}_{min}(n)), n = 0 \\ \hat{x}_{min}(n)h_{min}(0) + \sum_{k=0}^{n-1} \frac{k}{n}\hat{x}_{min}(k)h_{min}(n-k), n > 0 \end{cases}.$$

7. The method according to claim 1, wherein the step of using the real cepstrum of the frequency dependent target gain to provide a desired minimum phase filter impulse response comprises the further steps of:
applying the discrete sine transformation to the complex cepstrum and hereby providing a phase function of the filter transfer function that is minimum phase,
determining a filter transfer function that is minimum phase by combining the provided phase function with the frequency dependent target gain,
applying an inverse discrete Fourier transformation to the filter transfer function that is minimum phase and hereby providing the desired minimum phase filter impulse response.

8. The method according to claim 7, wherein the step of determining a filter transfer function that is minimum phase by combining the provided phase function with the frequency dependent target gain comprises the step of:
applying an exponential function to the combination of the provided phase function and the logarithm of the frequency dependent target gain.

9. The method according to claim 7, wherein the step of applying an inverse discrete Fourier transformation to the filter transfer function that is minimum phase and hereby providing the desired minimum phase filter impulse response comprises the steps of:
applying the discrete cosine transformation to the product of the real part of the filter transfer function and a normalization function and adding the result to the result of applying the discrete sine transformation to the imaginary part of the filter transfer function.

10. The method according to claim 7, comprising the further steps of:
providing a smoothing of the frequency dependent target gain by filtering the logarithm of the frequency dependent target gain vector with a zero phase smoothing filter.

11. A non-transitory computer readable medium carrying instructions which, when executed by a computer, cause the method of claim 1 to be performed.

12. The method according to claim 1, wherein the discrete cosine transformation is of type I and the discrete sine transformation is of type I; and
wherein the step of using the real cepstrum of the frequency dependent target gain to provide a desired minimum phase filter impulse response comprises the further steps of applying a window function to the real cepstrum of the frequency dependent target gain in order to provide a complex cepstrum representing the desired minimum phase filter impulse response.

13. A hearing aid (300) comprising, in a main signal branch:
an acoustical-electrical input transducer (301), a main digital filter (302) and an electrical-acoustical output transducer (303); and comprising, in an analysis signal branch:

an analysis filter bank (304), a frequency dependent target gain calculator (305), a natural logarithm calculator (306), a smoothing filter (307), a discrete cosine transformation circuit (308), a cepstrum domain window (309), a discrete sine transformation circuit (310), a digital combiner (311), an exponential calculator (312), a minimum phase filter transfer calculator (313), a minimum phase impulse response calculator (314) and a main digital filter coefficient calculator (315).

14. The hearing aid according to claim 13, wherein the discrete cosine transformation is of type I and the discrete sine transformation is of type I.

\* \* \* \* \*